(12) United States Patent
Adusumilli

(10) Patent No.: US 7,640,398 B2
(45) Date of Patent: Dec. 29, 2009

(54) HIGH-SPEED INTERFACE FOR HIGH-DENSITY FLASH WITH TWO LEVELS OF PIPELINED CACHE

(75) Inventor: Vijay P. Adusumilli, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 88 days.

(21) Appl. No.: 11/178,713

(22) Filed: Jul. 11, 2005

(65) Prior Publication Data

US 2007/0011405 A1  Jan. 11, 2007

(51) Int. Cl.
*G06F 12/00* (2006.01)
(52) U.S. Cl. .................. 711/122; 711/103; 711/129; 711/162; 711/165
(58) Field of Classification Search ............ 711/103, 711/117–119, 122, 129, 161–162, 165
See application file for complete search history.

(56) References Cited

U.S. PATENT DOCUMENTS

| | | | |
|---|---|---|---|
| 4,860,192 A | 8/1989 | Sachs et al. ............... 364/200 |
| 5,161,219 A | 11/1992 | Nicholson et al. | |
| 5,488,711 A | 1/1996 | Hewitt et al. ............... 711/103 |
| 5,699,317 A | 12/1997 | Sartore et al. ......... 365/230.06 |
| 5,850,534 A | 12/1998 | Kranich ..................... 395/471 |
| 6,209,067 B1* | 3/2001 | Collins et al. .............. 711/158 |
| 6,347,063 B1 | 2/2002 | Dosaka et al. ............. 365/233 |
| 6,604,171 B1 | 8/2003 | Sade | |
| 7,073,016 B2* | 7/2006 | Zitlaw ....................... 711/103 |
| 7,366,044 B2* | 4/2008 | Takase ...................... 365/205 |
| 2004/0193782 A1 | 9/2004 | Bordui | |
| 2005/0223158 A1* | 10/2005 | See et al. ................... 711/103 |
| 2005/0268025 A1* | 12/2005 | Smith et al. ............... 711/103 |

* cited by examiner

*Primary Examiner*—Jasmine Song
(74) *Attorney, Agent, or Firm*—Schwegman, Lundberg & Woessner P.A.

(57) ABSTRACT

A memory circuit and a method of operating a flash or EEPROM device that has two levels of internal cache. A memory device having a memory array, sense amplifiers, a data register, cache, an input-output circuit, and a control logic circuit is configured to output data while simultaneously reading data from the memory array to the data register or simultaneously copying data from the data register to a first level of internal cache. In addition, the memory device is configured to output data while simultaneously writing data from the data register to the memory array.

20 Claims, 5 Drawing Sheets

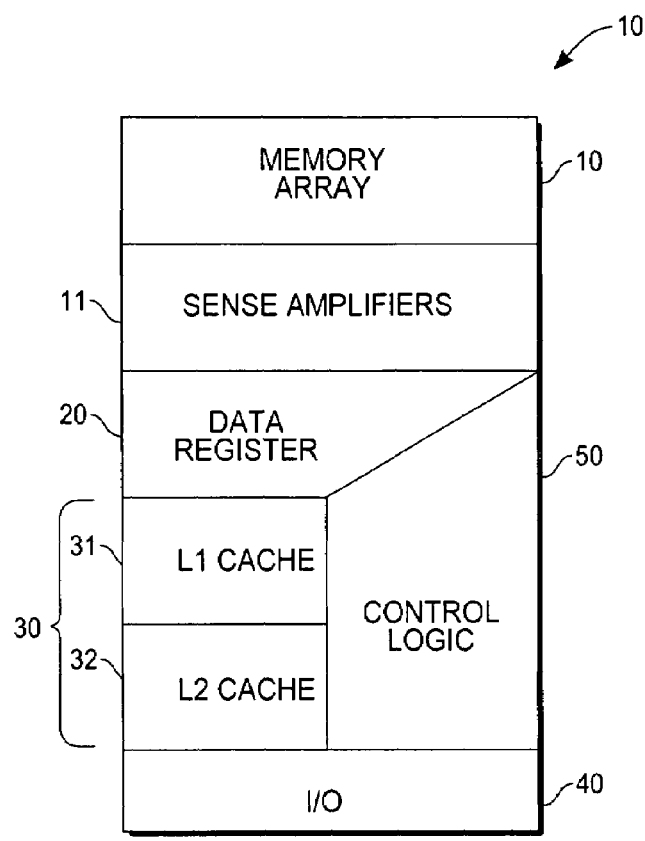
Fig._1
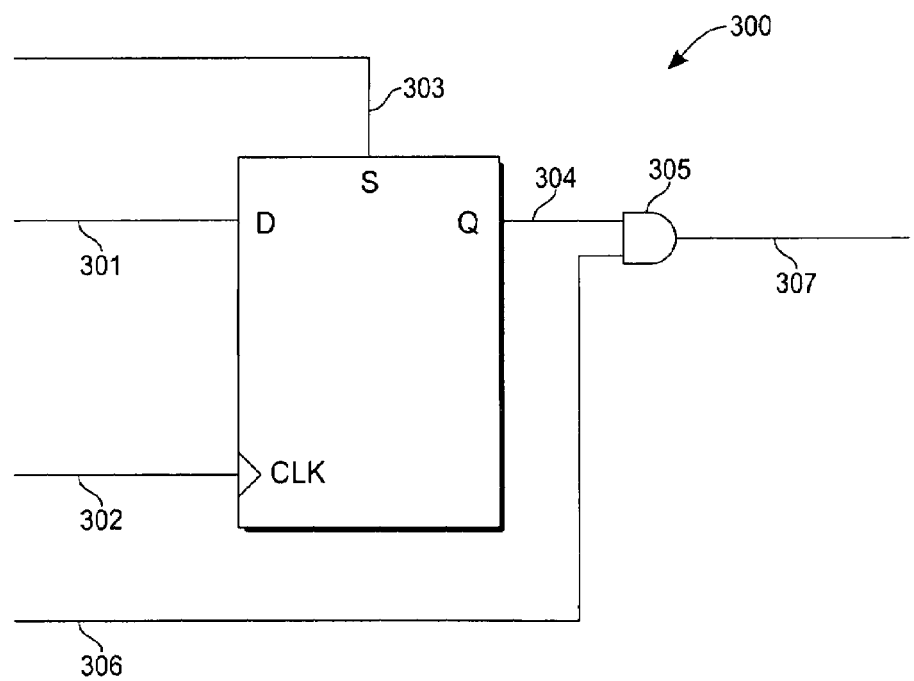
Fig._2

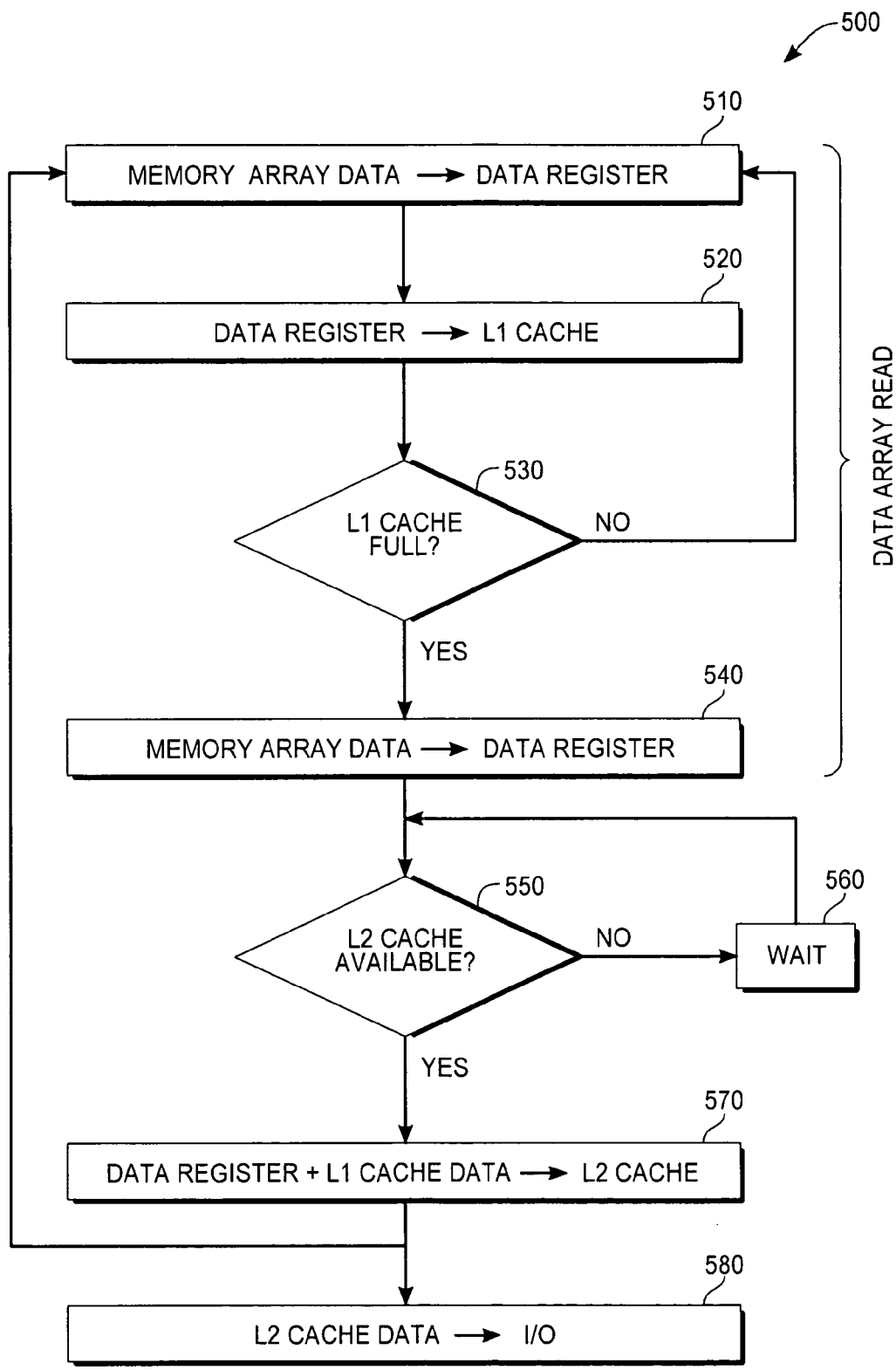
Fig._5

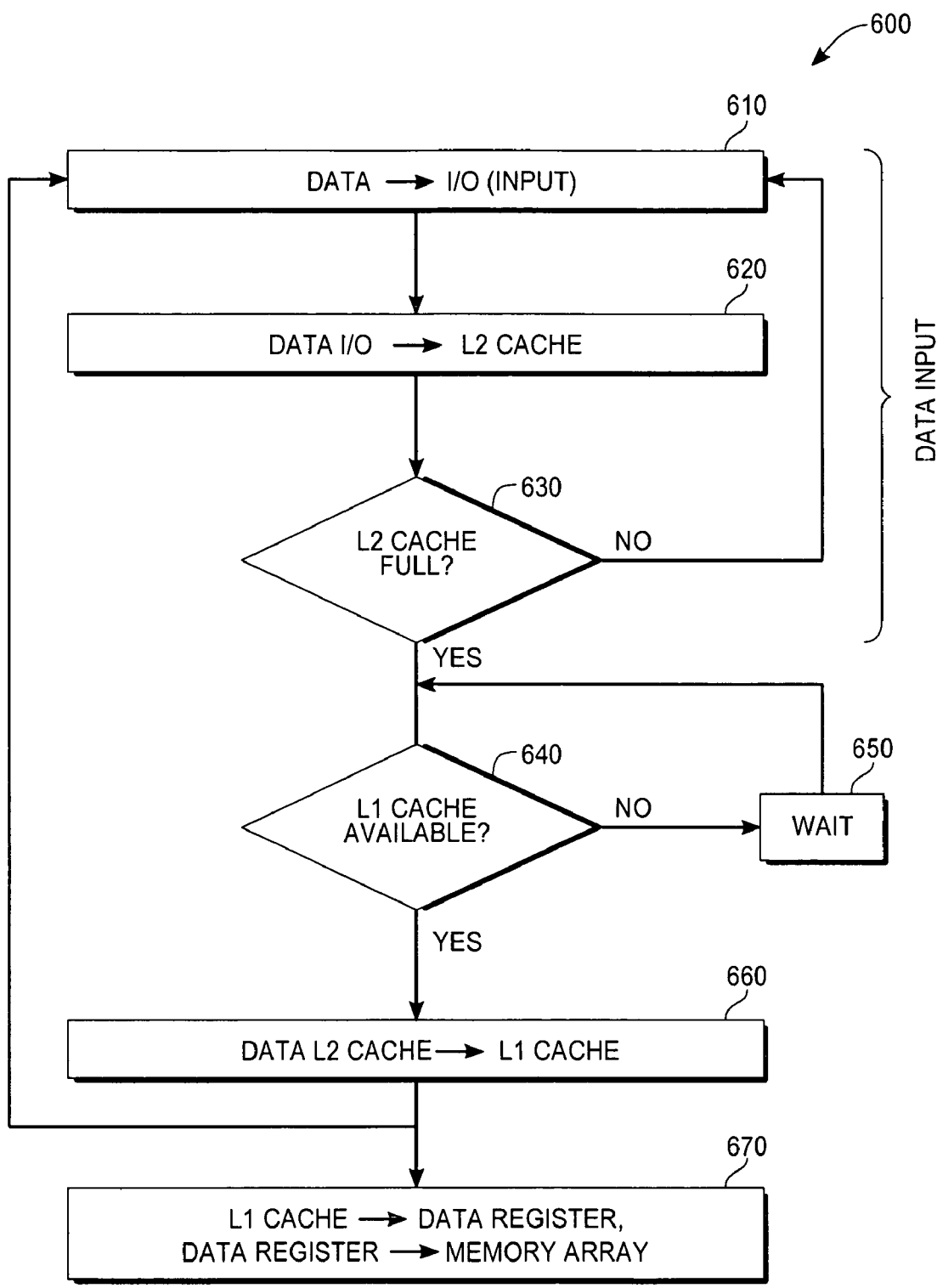
Fig._6

HIGH-SPEED INTERFACE FOR HIGH-DENSITY FLASH WITH TWO LEVELS OF PIPELINED CACHE

FIELD OF THE INVENTION

The present invention relates generally to nonvolatile memory devices, and more particularly to flash or EEPROM devices having two levels of internal cache.

BACKGROUND ART

Typically, a memory device will be coupled to an external control device such as a microprocessor. The microprocessor may be incorporated into a personal computer, a personal digital assistant, a telephone, a camera, or other device requiring a nonvolatile memory. A multitude of devices including PDAs, wireless devices, and cell phones continue to evolve and incorporate new multifunction capabilities. New capabilities include Web access, a digital camera, video, and music storage. To be marketable, these new devices must provide new capabilities at lower costs and in smaller spaces. In addition, nonvolatile memory devices must have higher capacities, improved speed, and improved interface flexibility.

For example, in the cell phone market, previous voice only cell phones utilized approximately 4 to 8 megabytes of memory to store data such as phone numbers, call logs, or messages. Currently, consumers now demand cell phones that are feature-rich. New cell phone devices now include Internet browsing, text messaging, games, Java applications, music, and digital cameras. These exemplary applications have caused an increase in memory requirements. Typically, cell phone manufacturers now use 64 to 256 megabytes or more memory to store large amounts of data including pictures and music.

Memory options when designing cell phones are numerous; a conventional memory architecture for a multifunction cell phone may use NOR flash for code storage, PSRAM for workspace, and NAND flash for data storage. Some designers also include SRAM for backup. NAND flash memory currently has the lowest cost per bit, however, NAND flash memory also has a slower random access time compared to other memory types and no capability for byte level programming.

A read access cycle time for NAND flash memory may be approximately 25 milliseconds. However, in typical applications, stored data is read into a page register and the data may be serially clocked from the memory device within a 50 nanosecond clock cycle. For example, U.S. Pat. No. 5,488, 711 to Hewitt et al. describes a write cache for reducing the time required to load data into an EEPROM device. Although the architecture described by Hewitt et al. improves the performance of the memory device, further performance increases using different or improved architectures are possible.

SUMMARY OF THE INVENTION

A nonvolatile memory device utilizes two portions, or levels of cache to reduce the time it takes to read and write data. In particular, the cache and page register are configured so that read pages of data are copied to a first level of cache. Pages of data are read to fill the first portion of cache. When the first portion of cache is full, another page of data is read, and the data stored in the page register and the first portion of cache are copied to a second portion of cache. A read or write operation may then be performed at the same time that the pages of data in the second portion of cache are being copied to an input-output circuit and serially transferred to a device that is external to the memory device. (A serial transfer can also refer to bit/byte/word serial transfers.)

BRIEF DESCRIPTION OF THE DRAWINGS

FIG. 1 is a exemplary block diagram of a memory device having a data register, an L1 cache and an L2 cache.

FIG. 2 is a block diagram of an exemplary L2 cache bit select circuit in an L2 bit array.

FIG. 5 is a flow diagram of an exemplary read operation of the block diagram circuit of FIG. 3.

FIG. 6 is a flow diagram of an exemplary write operation of the block diagram circuit of FIG. 4.

DETAILED DESCRIPTION OF THE INVENTION

Figure 3:
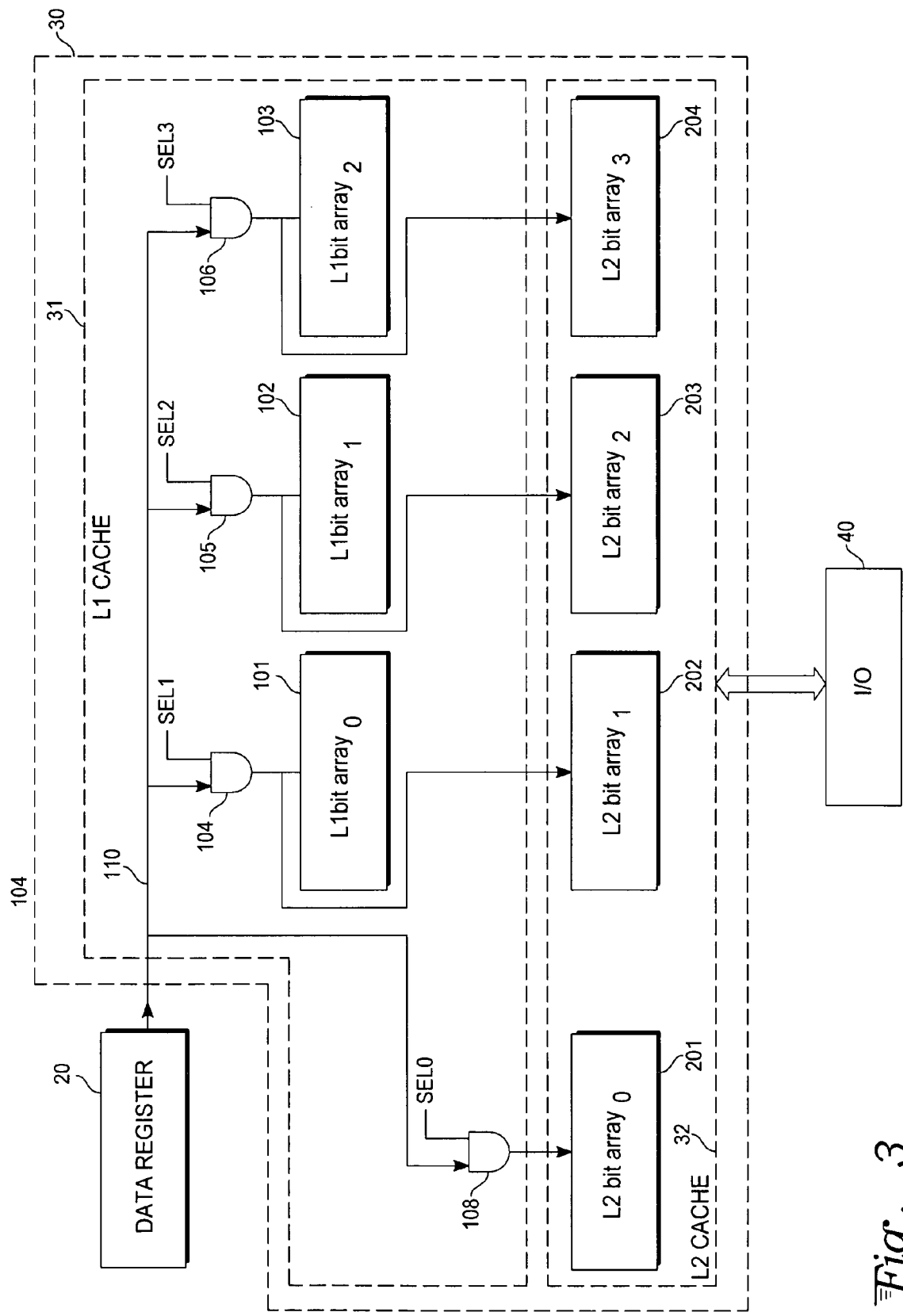
FIG. 3 is a block diagram of an exemplary L1 and L2 cache circuit of FIG. 1 used for a memory read operation.

Referring to FIG. 1, an exemplary nonvolatile memory device 100 includes a memory array 10 used to store data, sense amplifiers 11, a data register 20, a cache register 30, an input-output circuit 40, and a control logic circuit 50. The memory array 10 is typically a large capacity NAND flash memory coupled to a large number of sense amplifiers 11 having an ability to present a page of data, for example 528 by 16, in a single read cycle. Alternative page register capacities may be 256 by 16, 264 by 16, 512 by 8, 2112 by 8, 4096 by 8, or 4224 by 8. Stored data or data pages may additionally include extra bits, for example, error correction codes or error correction bits.

The control logic circuit 50 coordinates or controls the data transfer in the memory device. The control logic circuit 50 may be implemented as a state machine or a microcontroller or any sequential controller. In one embodiment, the control logic circuit 50 receives commands from a device that is external to the memory device 100. For example, a read command or a write command may be presented to the memory device 100 followed by an address or address range in the memory array 10. In response, the control logic circuit 50 controls word lines and bit lines coupled to the memory array 10 to address and read data from the memory array 10.

Additionally, the control logic circuit 50 coordinates or controls the transfer of data between the memory array 10 and the data register 20. The control logic circuit 50 also coordinates the transfer or copying of data between the data register 20 and L1 cache 31, the transfer or copying of data between the data register 20 or L1 cache 31 and L2 cache 32, and the control logic circuit 50 coordinates the transfer or copying of data between the L2 cache 32 and the input-output circuit 40. In one embodiment, the input-output circuit 40 contains a pipeline register.

During a read operation, data stored in the memory array 10 are transferred to the data register 20 via the sense amplifiers 11. The data register 20 is selectively coupled to the first level of L1 cache 31 and data temporarily stored in the data register 20 is copied to a selected portion of the L1 cache 31. Data continue to be read from the memory array 10 into the data register 20 and copied into the L1 cache 31 until the L1 cache 31 has been filled with data. Data stored in the L1 cache 31 are then copied to the L2 cache 32. Portions of the data stored in the L2 cache 32 are transferred or copied to the input-output circuit 40. The input-output circuit 40 then serially outputs the data, while the next read cycle is simultaneously being performed by the data register 20 and the L1 cache 31. (A serial transfer can also refer to bit/byte/word serial transfers.)

Alternatively, the input-output circuit 40 may also be directly coupled to the L1 cache 31 and data may be serially transferred directly from the L1 cache 31.

Referring to FIG. 2, a logical bit of data is presented to an L2 cache bit storage circuit 300 on bit line (D) 301 and the logical bit of data is latched into the L2 cache bit storage circuit 300 by enabling a data enable line (CLK) 302. A logical bit of data may be presented on bit line 301 from the data register 20 (FIG. 1), from the output of an L1 cache bit storage circuit, or from a data bus 110 (FIG. 3). The data enable line 302 latches the logical bit of data into the circuit. In one embodiment, the data are latched by a rising edge clock pulse presented on the data enable line 302. In another embodiment, the L2 cache bit storage circuit 300 includes an L2 cache set line (S) 303. The L2 cache set line 303 sets the logic state of the L2 cache bit storage circuit 300 to a predetermined value. An output line (Q) 304 of the L2 cache bit storage circuit 300 is coupled to an output enable device 305. For example, the output enable device 305 is controlled by an L2 address decode line 306 to selectively couple data from the L2 cache bit storage circuit 300 to an input-output circuit 40 (FIG. 1).

In FIG. 3, an exemplary embodiment of a data register 20, cache register 30, and I/O circuit 40 (FIG. 1) is shown. The data register 20 has a capacity to store a single page of data from the memory array 10 (not shown in FIG. 2). Both the L1 cache 31 and L2 cache 32 have the capacity to store multiple pages of data from the data register 20.

During a read operation, a page of data is read from the memory array 10 into the data register 20 and the data register page is copied to one of a plurality of L1 bit arrays 101, 102, 103 using a plurality of select devices 104, 105, 106. In one embodiment, a first page of data is read into the page register 20 and the data values are presented on a data bus 110. At least one of the select devices 104, 105, 106 couples the data bus 110 to a selected L1 bit array 101, 102, 103. For example, the select device 106 is activated coupling the data bus 110 to the L1 bit array$_2$ 103. The data register page is then copied to the L1 bit array$_2$ 103. At the same time, the select device$_2$ 105 and the select device$_1$ 104 do not actively couple the data bus 110 to the L1 bit array$_1$ 102 or to the L1 bit array$_0$ 101.

After the first data register page has been copied from the data register 20 to the L1 bit array$_2$ 103, the data register page is overwritten by a second page of data from the memory array 10. Pages of data continue to be read from the memory array 10 into the data register 20 until all of the L1 bit arrays 101, 102, 103 have had data copied to them and the L1 cache 31 is full of data. The second and third data register pages are copied from the data register 20 into the L1 bit array$_1$ 102 and the L1 bit array$_0$ 101. When the L1 bit arrays 101, 102, 103 are full of data, another read operation is performed and a page of data is read from the memory array 10 into the data register 20. In another embodiment, a data register page may be copied to any single selected L1 bit array 101, 102, 103 or copied to a plurality of L1 bit arrays. In an alternative embodiment, the first data register page is copied from the data register 20 directly to a single selected L2 bit array 201, 202, 203, 204 or copied from the data register 20 to a plurality of bit arrays in the L2 cache 32.

The data in the data register 20 and in the L1 cache 31 are then copied into the corresponding L2 bit arrays 201, 202, 203, 204. The page of data in the data register 20 is copied to the L2 bit array$_0$ 201 via the select device$_0$ 108, and the L1 bit arrays 101, 102, 103 are copied to the corresponding L2 bit arrays 202, 203, 204 in a single cycle. The data in the L2 cache 32 are then copied to an input-output circuit 40. The input-output circuit 40 then serially outputs the stored data, for example on a pin or line of the memory device 100, bit-by-bit to an external device such as a microprocessor (not shown).

In one embodiment, an entire page (four data register pages) of data is output word-by-word. A plurality of lines may provide multiple bits of data in parallel where the data are output with each line of the word providing a serial stream of data bits to an external device (not shown). For example, a 16-bit word of data is presented on 16 lines and each bit of the 16-bit word provides a serial stream of data so that an exemplary page of data at 528 by 16 is output to the microprocessor. In another example, the data in the input-output circuit 40 are presented to an external device as a 64-bit word (64 bits in parallel), serially clocking each bit of the 64-bit word for 264 cycles to present the entire page of data to the external device or microprocessor. Alternatively, any number of bits in parallel may be presented to an external device. Additionally, in other embodiments, the data lines may include additional bits such as error-checking codes or error correction bits.

Referring to FIG. 5, an exemplary read operation 500 is performed. A page of data in a memory array 10 (in FIG. 1) is accessed and copied 510 to a data register 20. Next, the page of data in the data register 20 is copied 520 to an L1 cache 31. A determination 530 is made whether the L1 cache is full. If the L1 cache 31 is not full, another page of data in the memory array 10 is accessed and copied 510 to the data register 20, and a new page of data is copied 520 from the data register 20 to the L1 cache 31. If the L1 cache 31 is full, another page of data in the memory array 10 is accessed and copied to the data register 20. When the L1 cache 31 and the data register 20 are full of data, a determination 550 is made whether the L2 cache 32 is available. If the L2 cache 32 is not available, data in the L1 cache 31 and the data in the data register 20 are held, and in one embodiment, a predetermined wait period is executed 560 or alternatively, a "no op" instruction is performed until the L2 cache 32 is available. When the L2 cache 32 is available, data in the L1 cache 31 and data in the data register 20 are copied 570 into the L2 cache 32. Data in the L2 cache 32 are then copied 580 to the input output-circuit 40, while data read operations 510, 520, 530, 540 involving the data register 20 and L1 cache 31 are simultaneously performed.

Figure 4:
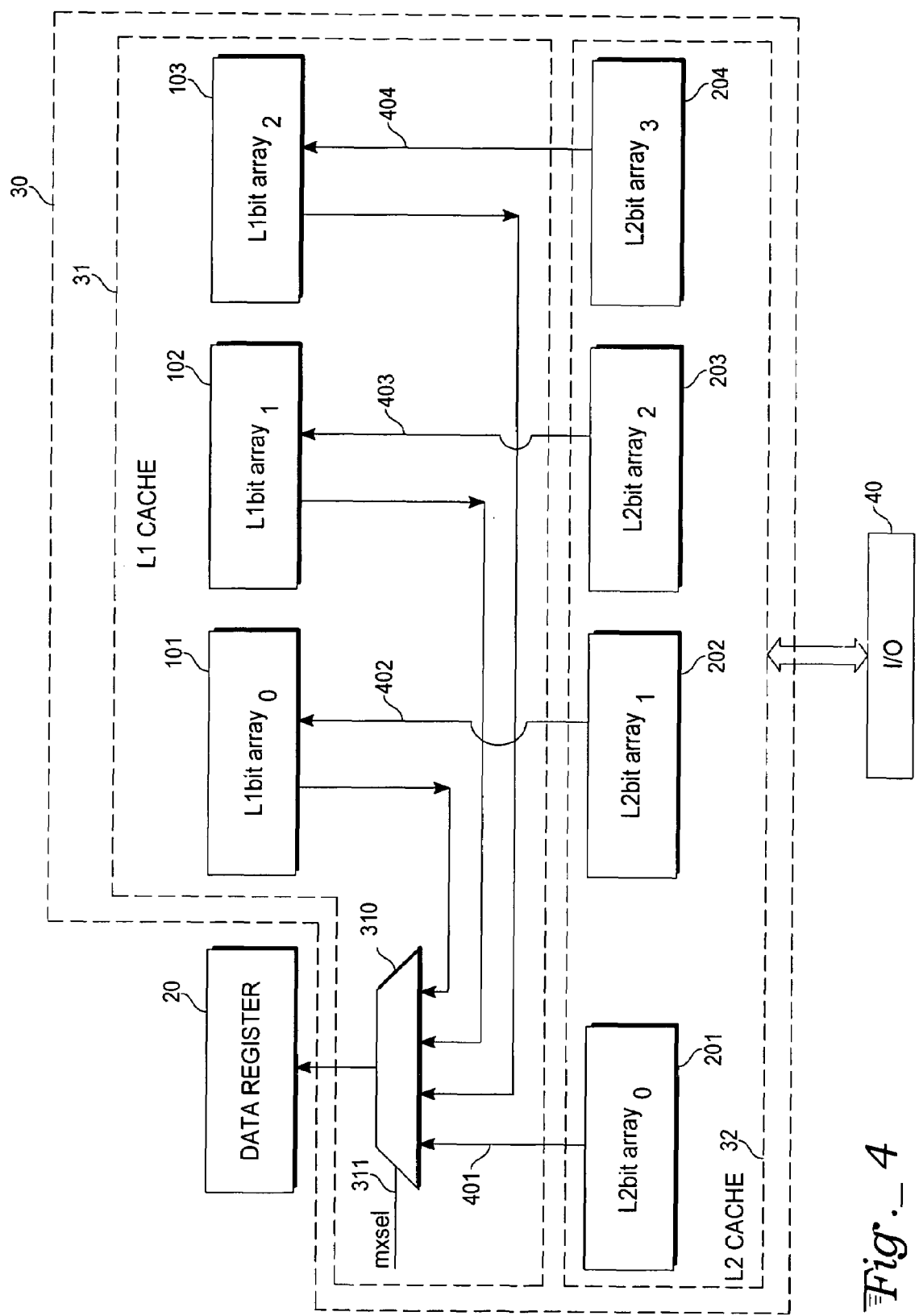
FIG. 4 is a block diagram of an alternative exemplary L1 and L2 cache circuit of FIG. 1 used for a memory write operation.

FIG. 4 illustrates a block diagram of an exemplary L1 and L2 32 cache circuit used for a memory device write operation. Similar to FIG. 3, the L1 cache 31 is configured with three L1 bit arrays 101, 102, 103, and the L2 cache 32 is configured with four L2 bit arrays 201, 202, 203, 204. The L2 cache 32 data output lines 401, 402, 403, 404 are correspondingly coupled to a multiplexer 310 and L1 bit arrays 101, 102, 103. During a write operation, data are copied to the L2 cache 32 from the input-output circuit 40. The data in the L2 cache 32 are then copied to the L1 cache 31 or to the data register 20 and written to the memory array 10.

The multiplexer 310 selectively couples the L2 bit array$_0$ 201 and the L1 bit arrays 101, 102, 103 to the data register 20. After the input-output circuit 40 has provided enough data to fill the L2 bit arrays 201, 202, 203, 204, the entire page data in the three L2 bit arrays 202, 203, 204 are copied to the corresponding L1 cache bit arrays 101, 102, 103. The multiplexer 310 selectively couples the L2 bit array$_0$ 201 to the data register 20 via multiplexer select line(s) 311 and the page of data in the L2 bit array$_0$ 201 is copied to the data register 20.

A first write operation is performed to the memory array 10 while the L2 bit arrays 202, 203, 204 are being copied to the L1 bit arrays 101, 102, 103.

In one embodiment, the L2 bit arrays 201, 202, 203, 204 are set to a predetermined value. New data are then copied into L2 bit arrays 201, 202, 203, 204 from the input-output circuit 40, and simultaneously, pages of data in the L1 cache 31 are copied to the data register 20 and written to the memory array 10 (FIG. 1). In another embodiment, the control logic circuit 50 (FIG. 1) may control or ramp any programming voltages (up or down) as required during a write operation. In an alternate embodiment, the control logic circuit 50 or a microcontroller (not shown) may suspend or stop execution of other instructions until a voltage ramp or write cycle is complete.

Referring to FIG. 6, an exemplary write operation 600 is performed. Data to be stored in the memory device 100 (in FIG. 1) is provided 610 from an external device (not shown) to the memory device 100 via I/O circuit 40. When the I/O circuit 40 is filled with data, the data is copied 620 to an L2 cache 32. A determination 630 is made whether the L2 cache 32 is full. A decision may also be based on whether an L2 cache 32 write operation from I/O 40 is complete. For example, if a user decided to write only a portion of the L2 cache 32 (not the entire L2 cache 32). In this example, before the user writes the data, the entire L2 cache is initialized so the partially filled L2 cache 32 data is transferred to the L1 cache 31 at the completion of the user data transfer from the input-output circuit 40 to the L2 cache 32.

When the L2 cache 32 is full, a second determination 640 is made whether the L1 cache 31 has completed any previous operation and is available 640. If the L1 cache 31 is not available, data in the L2 cache 32 are held and in one embodiment, a predetermined wait period is executed 650 or alternatively, a "no op" instruction is performed until the L1 cache 31 is available. When the L1 cache 31 is available, data in the L2 cache 32 are copied 660 into the L1 cache 31. Next, data in the L1 cache 31 are copied 670, page by page, to a data register 20 and written page by page from the data register to a memory array 10, while simultaneously inputting 610 additional data, and copying 620 the additional data to the L2 cache 32, 620 until a determination 630 is made that the L2 cache 32 is full.

Those of skill in the art will recognize that the present invention can be practiced with modification and alteration within the spirit and scope of the appended claims and many other embodiments will be apparent to those of skill in the art upon reading and understanding the above description. For example, one skilled in the art will recognize that data transfers and copies can be bit-by-bit, word-by-word, or page-by-page. A skill artisan further would recognize that an array in the present invention is not limited to a particular page size. The number of L1 and L2 bit array pages may differ compared to the above embodiments and examples. In addition, other embodiments of the input-output circuit 40, the L1 cache 31, and the L2 cache 32, may be implemented using a variety of page sizes to transfer or copy pages of data. Also, the L1 and L2 cache pages may be a single cache memory, having multiple pages that may be flexibly controlled. In addition, the select devices coupled to the first level of cache (L1) for a read operation may also be incorporated or coupled to the circuit described to perform a write operation, and the read and write operations described can be performed by a single circuit arrangement. The description is thus to be regarded as illustrative instead of limiting. The scope of the invention should, therefore, be determined with reference to the appended claims, along with the full scope of equivalents to which said claims are entitled.

What is claimed is:

1. A nonvolatile memory device comprising:
a memory array configured to store data;
a data register selectively coupled to the memory array and configured to copy at least one page of data between the memory array and the data register;
a cache register disposed in the memory device;
a first portion of the cache register selectively coupled to the data register and configured to copy the at least one page of data between the data register and the first portion of the cache register;
a second portion of the cache register selectively coupled to the data register and the first portion of cache register, the second portion of cache register configured to copy the at least one page of data between either the first portion of the cache register or the data register and the second portion of the cache register;
an input-output circuit selectively coupled to both the first portion of the cache register and the second portion of the cache register and configured to serially output a plurality of data bits of the at least one page of data;
a control logic circuit selectively coupled to the memory array, the data register, the first portion of the cache register, the second portion of the cache register, and the input-output circuit and configured to selectively couple the second portion of the cache register to the input-output circuit to copy data between the second portion of the cache register and the input-output circuit, the control logic circuit being further configured to simultaneously selectively couple the memory array to the data register to copy data between the memory array and the data register or to simultaneously selectively couple the data register to the first portion of the cache register to copy data between the data register and the first portion of the cache register; and
wherein the data register is configured to determine whether the first portion of the cache is full and copy an additional page when the first portion of the cache is not full, determine if the second portion of the cache is full when the first portion of the cache is full, and hold the data in the data register for a pre-defined waiting period, if the first and second portion of the cache is full.

2. The nonvolatile memory device of claim 1 wherein the data register is configured to store at least 256 words of data.

3. The nonvolatile memory device of claim 1, wherein the first portion of the cache register is configured to store at least three pages of data.

4. The nonvolatile memory device of claim 1, wherein the second portion of the cache register is configured to store at least four pages of data.

5. The nonvolatile memory device of claim 1, wherein the input-output circuit is configured to serially output data for each bit of a parallel word.

6. The nonvolatile memory device of claim 1, wherein the first portion of the cache register is coupled to the data register by a multiplexer.

7. The nonvolatile memory device of claim 1, wherein the second portion of the cache register is coupled to the data register by a multiplexer.

8. The nonvolatile memory device of claim 1, wherein if the first and second portion of the cache register is unavailable then the data register is configured to provide a specific instruction until the second portion of the cache register is available for copy.

9. A method of reducing a data transfer time of a nonvolatile memory device comprising:

copying at least one page of data between a nonvolatile memory array and a data register;

copying the at least one page of data either between the data register and a first level of a cache register or a second level of the cache register;

copying a plurality of bits of the at least one page of data between either the first level of the cache register or the second level of the cache register and an input-output circuit while simultaneously copying the at least one page of data between the nonvolatile memory array and the data register or while simultaneously copying the at least one page of data between the data register and the first level of the cache register;

determining whether the first level of the cache register is full and copying an additional page when the first level of the cache register is not full;

determining whether the second level of the cache is full when the first level of the cache is full; and holding data in the data register for a pre-defined waiting period when the first and second level of the cache is full.

10. The method of claim 9, wherein the data register is configured to store at least 256 words of data.

11. The method of claim 9, wherein at least three pages of data are copied to the first level of the cache register.

12. The method of claim 9, wherein at least four pages of data are copied to the second level of the cache register.

13. The method of claim 9 further comprising copying at least one page of data between the first level of the cache register and the second level of the cache register and copying at least one page of data between the data register and the second level of the cache register.

14. The method of claim 13, wherein the copying at least one page of data between the data register and the second level of the cache register is performed by coupling the data register to the first level of the cache register using a multiplexer.

15. The method of claim 9, wherein the copying at least one page of data between the data register and the first level of the cache register is performed by coupling the data register to the first level of the cache register using a multiplexer.

16. A nonvolatile memory device comprising:
a memory array configured to store data;
a data register selectively coupled to said memory array;
a cache memory disposed within the device;
a first level of the cache memory and a second level of the cache memory, each of the first and second level of the cache memory selectively coupled to said data register;
an input-output circuit selectively coupled to said first and second level of the cache memory;
a means for coupling at least one data page between said memory array and said data register;
a means for coupling said at least one data page between said data register and said first or second level of the cache memory;
a means for outputting a plurality of data pages while simultaneously coupling said memory array and said data register or while simultaneously coupling said data register and said first or second level of the cache memory; and
wherein the data register is configured to determine whether the first level of the cache is full and copy an additional page when the first level of the cache is not full, determine if the second level of the cache is full when the first level of the cache is full, and hold the data in the data register for a pre-defined waiting period, if the first and second level of the cache is full.

17. The nonvolatile memory device of claim 16, wherein the first level of the cache memory is configured to store at least three pages of data and the second level of the cache memory is configured to store at least four pages of data.

18. The nonvolatile memory device of claim 16, wherein the second level of the cache memory is coupled to the first level of the cache memory to copy three pages of data from the first level of the cache memory to the second level of the cache memory and coupled to the data register to copy a single page of data from the data register to the second level of the cache memory.

19. The nonvolatile memory device of claim 16, wherein the first level of the cache memory is coupled to the data register by a multiplexer.

20. The nonvolatile memory device of claim 16, wherein the means for outputting the plurality of data pages serially outputs data for each bit of a parallel word.

* * * * *